United States Patent
Lee et al.

(10) Patent No.: US 7,739,065 B1
(45) Date of Patent: Jun. 15, 2010

(54) INSPECTION PLAN OPTIMIZATION BASED ON LAYOUT ATTRIBUTES AND PROCESS VARIANCE

(75) Inventors: Sherry F. Lee, San Jose, CA (US);
Kenneth R. Harris, San Fransico, CA (US); David Joseph, Santa Cruz, CA (US)

(73) Assignee: PDF Solutions, Incorporated, San Jose, CA (US)

( * ) Notice: Subject to any disclaimer, the term of this patent is extended or adjusted under 35 U.S.C. 154(b) by 0 days.

(21) Appl. No.: 11/761,455

(22) Filed: Jun. 12, 2007

(51) Int. Cl.
*G01N 17/02* (2006.01)

(52) U.S. Cl. ............... 702/83; 702/57; 702/117; 702/124

(58) Field of Classification Search ............... 702/39, 702/35, 64, 84, 159, 179, 181; 134/1.2; 324/765; 438/12, 200
See application file for complete search history.

(56) References Cited

U.S. PATENT DOCUMENTS

| | | | |
|---|---|---|---|
| 6,269,179 B1 * | 7/2001 | Vachtsevanos et al. | 382/149 |
| 6,433,561 B1 * | 8/2002 | Satya et al. | 324/753 |
| 7,061,625 B1 * | 6/2006 | Hwang et al. | 356/511 |
| 7,107,158 B2 * | 9/2006 | Steele et al. | 702/35 |
| 2004/0254752 A1 * | 12/2004 | Wisniewski et al. | 702/84 |
| 2007/0156379 A1 * | 7/2007 | Kulkarni et al. | 703/14 |

* cited by examiner

Primary Examiner—Hal D Wachsman
Assistant Examiner—Felix E Suarez

(57) ABSTRACT

Methods for determining customized defect detection inspection plans are provided. One method includes fabricating a test chip and generating test chip data from the fabricated test chip. Then, defining systematic signatures from the generated test chip data and identifying a yield relevant systematic signature from the defined systematic signatures. The method includes identifying a layout pattern associated with the yield relevant systematic signature and locating the identified layout pattern on a process module layer of a product chip. Further, the method includes defining a customized defect detection inspection or metrology methodology for detecting systematic defects on the process module layer based on the identified layout pattern associated with the yield relevant systematic signature.

41 Claims, 10 Drawing Sheets

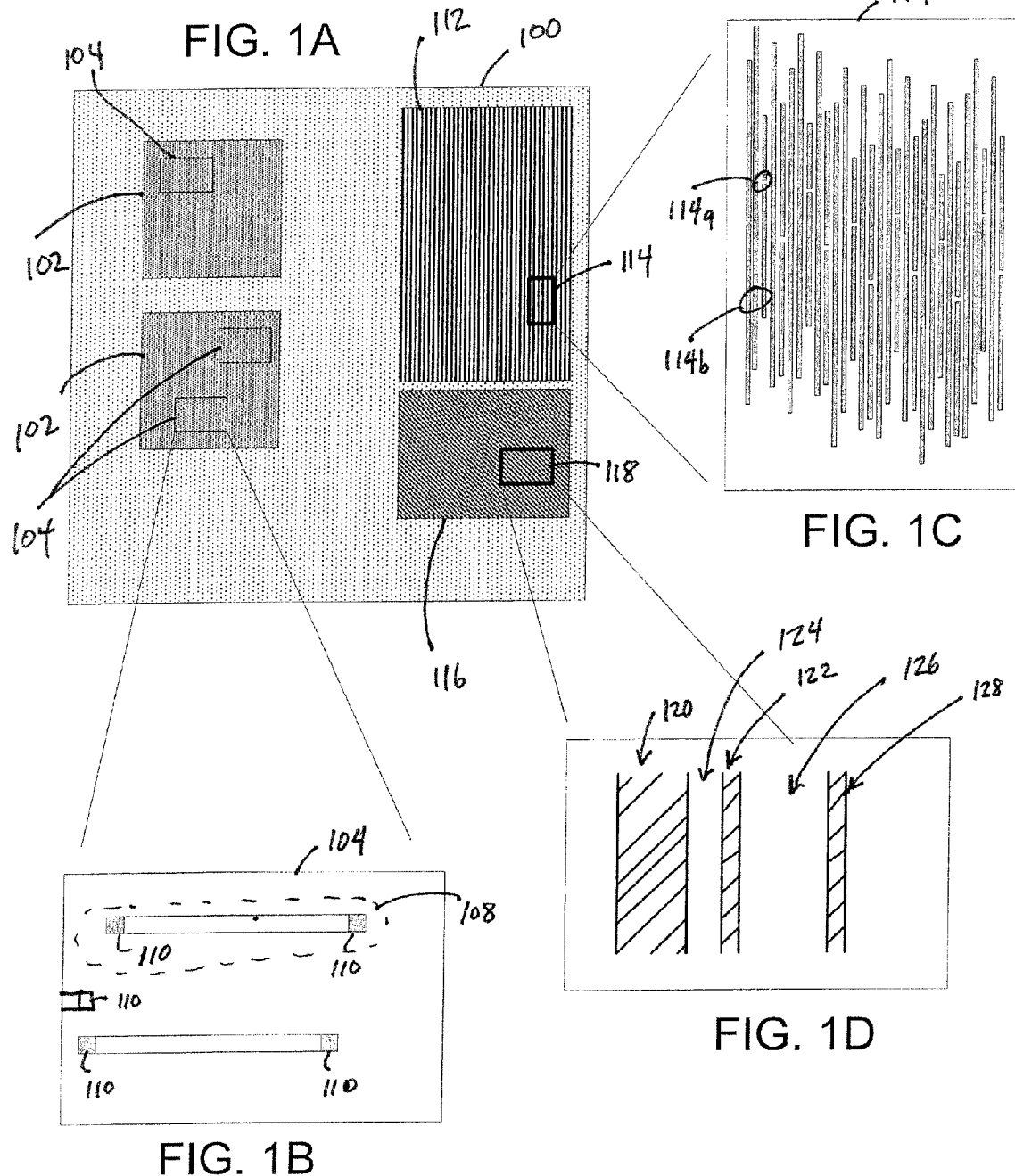

| Signature | Inputs | Optimization |
|---|---|---|
| Within wafer spatial pattern | • Process module layer signature from test chip<br>• Product spatial signature | • Focus inspection area on highest variability regions |
| Wafer-wafer variation | • Process module layer signature from test chip<br>• Product signature | • Sample enough wafers to catch signature |
| Layout systematic signatures | • Test chip analysis of layout attributes affecting product yield<br>• Product layouts | • Sample areas with expected layout attribute signatures<br>• Sample random defects |
| Lot-lot variation | • Process module layer signature from test chip<br>• Product signature | • Higher lot sampling for modules with lot-to-lot signature |

Figure 7

Variance and Layout-based Inspection Plans

| Category | Proposed Plans | Implications |
|---|---|---|
| % lots sampled | Calculate based on effect of missing outlier lots | - Optimized sampling for exiting module variance signatures |
| Wfrs /lot | Increase if wafer- wafer variability key yield loss component Same wafers all stages | - Effective for wafer - wafer variability reduction<br>- Same wafers and sampled area for DSA |
| Wafer coverage | Optimize regions for inspection, e.g. random vs. layout systematic issues | - Catch wafer spatial patterns<br>- Catch layout systematic issues |
| Recipe set up | | - More precise thresholds depending on patterns |
| Inspection points | Use e-test overlay, CR, KR on CV to determine most effective layers for inspection | - Better coverage of high impact yield loss mechanisms |
| Defect sampling for review | Set up filters for review (e.g. edge, large, size x) | - Focus on key defects of interest including layout systematics. Update when defect modes change.<br>- Use of layout attribute classes and spatial information can improve inspection effectiveness |
| Micro - Partitioning (MP) | Use e test data to set module priorities. Perform MP on key modules | - Highly effective tool for diagnosis |

Adjust inspection strategies depending on module variability.
Include layout attribute systematic and spatial systematic issue

Figure 8

INSPECTION PLAN OPTIMIZATION BASED ON LAYOUT ATTRIBUTES AND PROCESS VARIANCE

FIELD OF THE INVENTION

The present invention provides the methods of determining more effective defect detection inspection and metrology methodologies for identifying defects for integrated circuits. More particularly, embodiments of the present invention provide the methods of determining customized defect detection inspection and metrology methodologies for identifying yield relevant systematic defects for integrated circuits.

BACKGROUND

Description of the Related Art

Designers and manufacturers of integrated circuits (ICs) are confronted with increasing challenges of yield loss as the design and manufacture of ICs advance to smaller technology nodes. To maximize yield and minimize defects, early and accurate defect detection and correction are important aspects of designing and manufacturing ICs.

Traditional inspection plans for defect detection have focused on identifying random issues. However, an increasing percentage of yield loss is no longer induced by random defect mechanisms. Instead, as the design and manufacture of ICs advance to smaller technology nodes, a major component of yield loss is caused by systematic defects induced by layout attributes in the design and manufacture of the ICs.

Accordingly, there is a need for inspection and metrology methods that are capable of detecting systematic defects induced by layout attributes of the integrated circuits.

SUMMARY

The present invention fills the need of inspection and metrology methods that are capable of providing yield relevant defect detection for maximizing yield of integrated circuits by providing the methods to determine customized defect detection inspection and metrology methodologies. The customized defect detection inspection and metrology methodologies, as provided by the embodiments of the present invention, account for both design characteristics and manufacturing process variations to identify layout patterns, features, sources, etc. that could induce yield relevant systematic defects that could cause either functional or parametric failures for integrated circuits.

In one embodiment of the present invention, an inspection plan includes analyzing the layout attributes or features on the integrated circuit that are likely to cause defects and analyzing the fabrication processes that are used to create these features on the integrated circuits. Tests are run and types of failures and fail rates are identified and prioritized and an inspection plan is formulated to perform inspection to address the source for these failures. Analyzing both the layout attributes and process parameters and formulating the inspection plan to address both, results in more accurate identification and isolation of causes that are likely to introduce defects on the chip during the manufacturing process. The present invention can be implemented in numerous ways.

In another embodiment, a method for determining customized defect detection inspection plans is disclosed. This method includes fabricating a test chip and generating test chip data from the fabricated test chip. Then, defining systematic signatures from the generated test chip data and identifying a yield relevant systematic signature from the defined systematic signatures. The method includes identifying a layout pattern associated with the yield relevant systematic signature and locating the identified layout pattern on a process module layer of a product chip. Further, the method includes defining a customized defect detection inspection or metrology methodology for detecting systematic defects on the process module layer based on the identified layout pattern associated with the yield relevant systematic signature.

In another embodiment of the present invention, a method for making a customized inspection plan for optimizing the identification of defects on a target product chip during manufacture of a test chip is defined. In this method, a test chip is run through a plurality of processes and a plurality of layout patterns that define systematic signatures are identified. The test chip includes particular layout patterns similar to those to be found in the target product chip. A product type for the target product chip is identified and particular systematic signatures capable of being found in the product type are selected. The systematic signatures define features that can potentially introduce a defect in the test chip. The particular systematic signatures on pattern layouts of the target product chip are located. An inspection plan to address each of the particular systematic signatures on the target product chip during fabrication of the target product chip is defined.

In yet another embodiment, a method for making a customized inspection plan for identifying defects on a target product chip is defined. In this method, a test chip is provided. The test chip is defined by running a plurality of physical process operations to create a plurality of process module layers on the test chip. Each of the plurality of process module layers includes a plurality of layout features on the test chip similar to those to be found in the target product chip. Electrical tests are performed on the test chip. The electrical test identifies layout features that have a failure. A yield loss for each failure in each of the plurality of process module layers referencing variance data for each of the plurality of process module layers is quantified. The variance data includes data related to the plurality of physical process operations used in creating the layout features in each of the plurality of process module layers of the test chip. Failures that contribute most to yield loss are ranked. The failures detected on the test chip identify the specific layout feature and the specific process module layer associated with each of the failures. The variance data associated with each of the ranked failures are identified. An inspection plan for inspecting product chips during processing of each of the plurality of process module layers of the product chip is generated. The inspection plan is adjusted based on the identified variance data associated with each of the ranked failures on the test chip.

In another embodiment, a method for making a customized inspection plan for identifying defects on a target product chip is defined. In this embodiment, the method includes providing a test chip, the test chip defined by running a plurality of physical process operations to create a plurality of process module layers on the test chip. Each of the plurality of process module layers on the test chip includes layout features to be found on the product chip. A test is performed on the test chip, the test identifying failures on the test chip. Yield loss for the failures detected at each of the plurality of process module layers on the test chip are quantified. Variance data for each of the plurality of process module layers are obtained based on tests performed on the test chip. The variance data includes data related to the plurality of physical process operations used in creating the layout features in each of the plurality of process module layers of the test chip. Failures that contribute most to yield loss are ranked. The variance data associated with each of the ranked failures are identified. An inspection plan for inspecting target product chips during processing of each of the plurality of process module layers of the target product chip is generated. The inspection plan is adjusted based on the variance data associated with each of the ranked failures on the test chip.

The present invention, thus, describes the methods for determining customized defect detection inspection plans for identifying defects on an integrated circuit (IC). These customized defect detection inspection plans address both layout related issues and process related issues that may induce defects on the IC and isolate the source of defects so they can be addressed in a timely manner resulting in yield improvement. Additionally, these customized defect detection inspection plans are adaptable across various manufacturing environments.

BRIEF DESCRIPTION OF THE DRAWINGS

The invention may best be understood by reference to the following description taken in conjunction with the accompanying drawings. These drawings should not be taken to limit the invention to the preferred embodiments, but are for explanation and understanding only.

FIGS. 1A-1D illustrate layout patterns of an integrated circuit.

FIG. 7 illustrates a table identifying the input and optimization considerations used in formulating a customized inspection plan, in one embodiment of the invention.

FIG. 8 illustrates a table identifying the inspection implications related to a customized defect detection inspection plan, in accordance with one embodiment of the present invention.

DETAILED DESCRIPTION

Figure 2A:
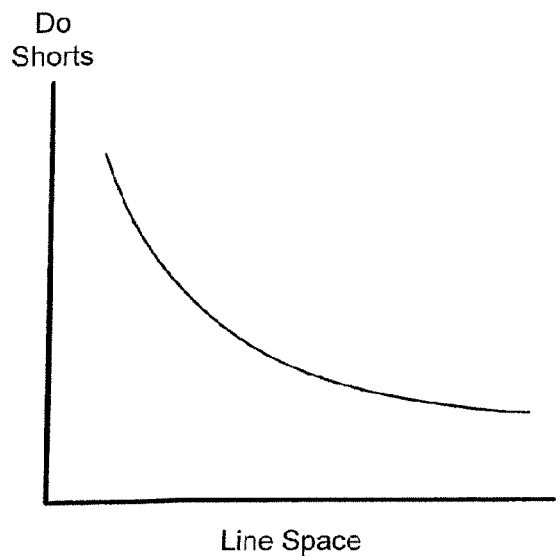
FIGS. 2A-2D illustrates one example of a systematic signature, in accordance with one embodiment of the present invention.

Embodiments of the present invention provide methods of determining more effective defect detection inspection and metrology methodologies for identifying defects for integrated circuits. More particularly, embodiments of the present invention provide the methods of determining customized defect detection inspection and metrology methodologies for identifying yield relevant systematic defects for particular layout patterns in integrated circuits. Unlike random defects, which may be caused by particle contamination while an integrate circuit is being fabricated, systematic defects may be induced by the layout patterns of the integrated circuit. Layout patterns are identifiable patterns that have a certain geometric shape, shapes, characteristics, etc. The layout patterns can be defined on a mask, a drawing, a file (e.g., GDSII, etc.), or can be transferred to a process module layer of a semiconductor or integrated circuit. Examples of layout patterns are illustrated in FIGS. 1A-1D. FIG. 1A illustrates a region 100 on a process module layer (e.g., metal-1 layer, metal-2 layer, poly-1 layer, poly-2 layer, etc.) of an integrated circuit having a plurality of layout patterns 102, 112, and 116. As illustrated in FIG. 1B, a close up view 104 shows layout pattern 102 which may be isolated lines 108 having isolated vias 110 near the two ends of the isolated lines 108. The isolated vias 110 are spaced widely apart. As illustrated in FIG. 1C, a close up view 114 shows layout pattern 112 which may be closely spaced lines. As indicated by 114a and 114b, the lines of layout pattern 112 are closely spaced to their adjacent neighboring lines. As illustrated in FIG. 1D, a close up view 118 shows layout pattern 116 which may be a wide line 120 next a thin line 122 with a small space 124 in between separating the two lines 120 and 122. In addition, a wide space 126 separates thin line 122 and another thin line 128. A process module layer (PML) is a physical layer of material having identifiable features formed on an integrated circuit chip as a result of performing a plurality of physical process operations as a part of fabricating the integrated circuit chip. For example, a process module layer may include a metallization layer that may include a plurality of metal contacts that connect the underlying transistors with one another. Other process module layers may include one or more features defined at particular stages of the fabrication process. A process module layer can also be considered as an identifiable stage in the fabrication process, where certain layers or physical process operations have been performed, using one or more process fabrication tools (e.g., the fabrication tools might be configured to perform the fabrication processes such as CVD, Etch, ALD, CMP, ECP, Implant, etc.).

Embodiments of the present invention provide the methods to determine customized defect detection inspection and metrology methodologies or plans that consider the layout patterns of the integrated circuits, the fabrication process, and the fabrication process variability to identify potential layout patterns where yield relevant systematic defects may occur. The customized defect detection inspection and metrology methodologies or plans make inspections more effective by identifying the areas where inspection and metrology measurements should be performed, which are the locations where the layout patterns that could induce yield relevant systematic defects are likely to be found, and the representative sampling to account for fabrication process variation (e.g., lot-to-lot sampling to identify lot-to-lot variations, wafer-to-wafer sampling to identify wafer-to-wafer variations, die-to-die or zonal sampling to identify die-to-die or zone-to-zone variations, etc.) to accurately identify the yield relevant systematic defects. In addition, the customized defect detection inspection and metrology methodologies or plans also identify the most appropriate inspection and metrology methods and equipment (e.g., inline inspection (visual, infrared, bright-field, dark-field, etc.), CD-SEM inspection, SEM inspection, electron beam inspection, electrical test, etc.) for detecting the yield relevant systematic defects that are likely to be present. Once the yield relevant systematic defects are found, integrated circuit designers and manufacturers could determine the most effective way to minimize these yield relevant systematic defects (e.g., change the layout patterns of the integrated circuits, change the manufacturing process for fabricating the integrated circuits, adjust the process parameters of the established fabrication process, tune the process equipment, etc.) to improvement yield. Several embodiments for determining customized defect detection inspection and metrology plans will now be described in more detail.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention. Several exemplary embodiments of the invention will now be described in detail with reference to the accompanying drawings.

Figure 2B:
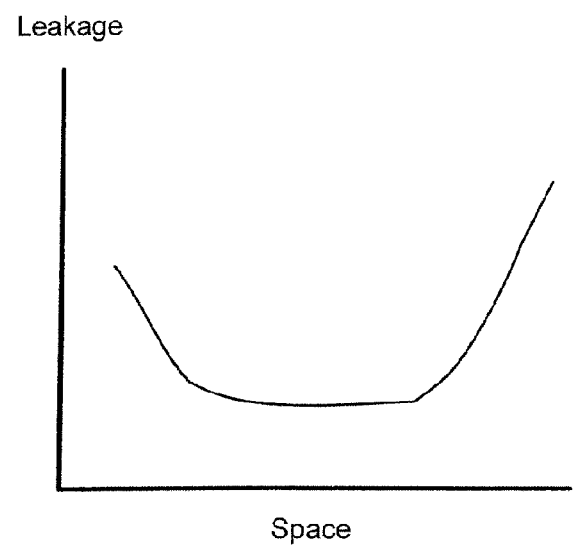
Figure 2C:
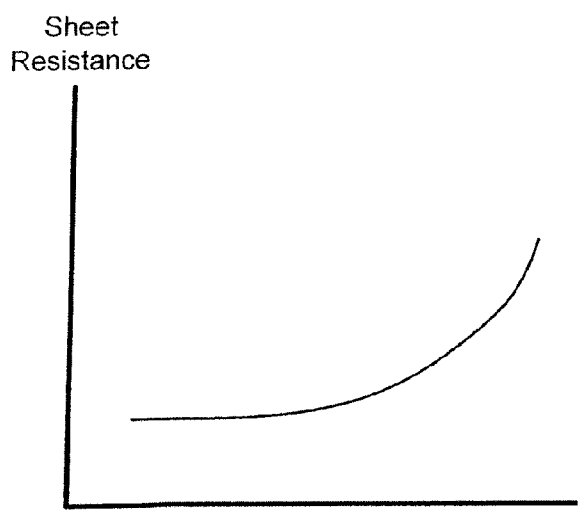
Figure 2D:
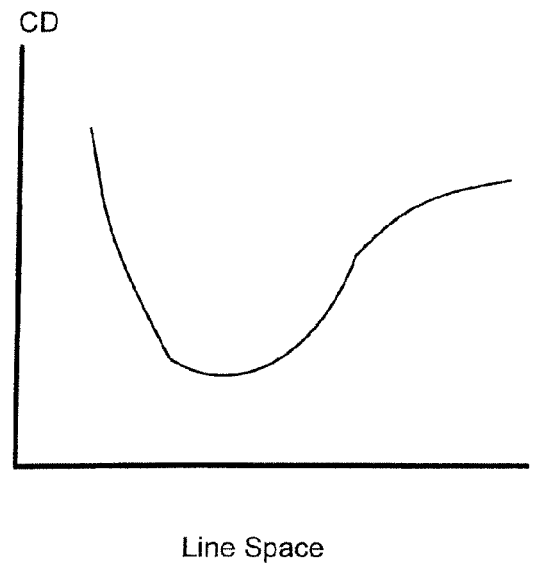

Referring back to FIGS. 1A-1D, a systematic signature may be determined for each layout pattern 102, 112, and 116 as well as any other layout patterns for an integrated circuit. A systematic signature illustrates a represented relationship between a metric and an attribute of a layout pattern associated with an integrated circuit. Systematic signatures are used to determine the layout patterns that could induce yield relevant systematic defects. Metrics of an integrated circuit include defect density (D0), defect count, number of failures, resistance, capacitance, IC yield or any other measurable quantities or properties related to an integrated circuit. Layout attributes are measurable features associated with layout patterns of an integrated circuit, e.g., spacing between isolated lines, width of isolated lines, distance between line ends, or any measurable features or characteristics related to layout patterns as well as any combination of measurable features or characteristics. One example of a systematic signature may be a relationship between defect density ($D_o$) and line spacing (x) between isolated lines of a layout pattern on a process module layer of an integrated circuit. Another example of a systematic signature may be a relationship between resistance and the width and spaces or distances between lines on one process module layer and the density of the lines in the underlying process module layer. FIGS. 2A-2D provide one example of a systematic signature. FIG. 2A shows a represented relationship, such as a graphical representation, between defect density ($D_o$) and the spacing or distance between isolated lines for one process module layer of an integrated circuit. In this particular example, for a particular layout pattern the defect density rises or increases as the spacing between isolated lines is increased. Other systematic signatures providing different represented relationships between different metrics and different layout attributes may also be used as part of the process for determining customized defect detection inspection and metrology plans to effectively inspect layout patterns for yield relevant systematic defects. For example, FIG. 2B shows a systematic signature of a represented relationship between leakage current and line spacing for a particular layout pattern in a region of a process module layer of an integrated circuit. FIG. 2C shows a systematic signature of a represented relationship between electrical resistance and underlayer density for a particular layout pattern in one region of a process module layer of an integrated circuit. FIG. 2D shows a systematic signature of a represented relationship between critical dimension and spacing for a particular layout pattern in another region of a process module layer of an integrated circuit.

Figure 3A:
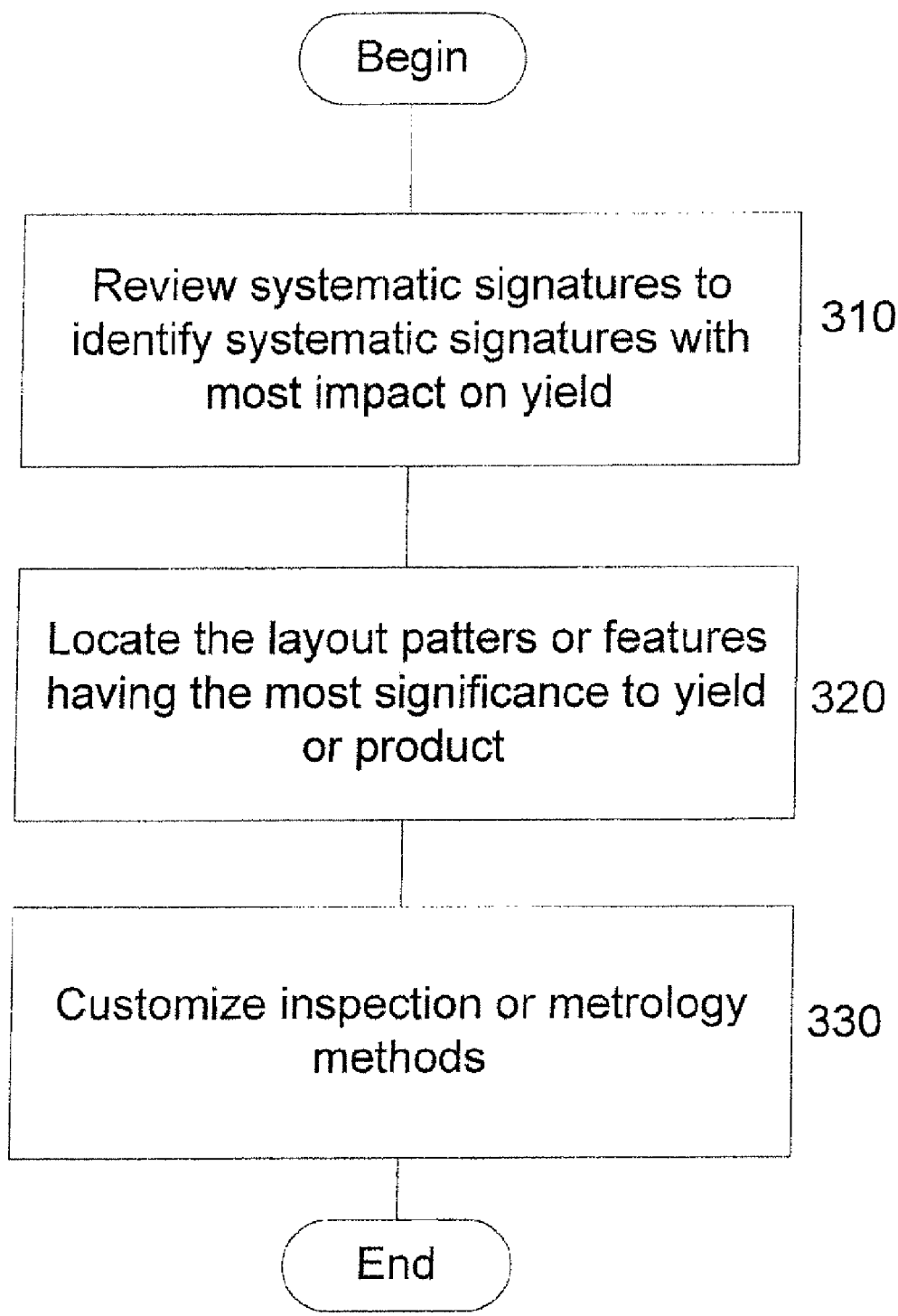
FIG. 3A illustrates a flow chart of operations for determining a customized defect detection inspection plan for an integrated circuit, in accordance with one embodiment of the present invention.

In one embodiment of the present invention, as illustrated in the flow chart of FIG. 3A, the method of determining defect detection inspection and metrology methodologies or plans may be initiated by reviewing systematic signatures for different metrics and layout attributes to identify the systematic signature that would have the most impact on yield for one or more process module layers of an integrated circuit, in step 310. In step 320, the layout patterns or features associated with the systematic signature that have the most impact on yield are located on a product integrated circuit. In step 330, based on the layout patterns or features, customized defect detection inspection and metrology methodologies or plans for identifying systematic defects on the product integrated circuit are defined. The customized defect detection inspection and metrology methodologies or plans specify the locations or regions of a process module layer of the integrated circuit that should be inspected to look for the yield relevant systematic defects. In addition, the customized defect detection inspection and metrology methodologies or plans also include specifying the type of inspection and metrology equipment (e.g., inline inspection (visual, infrared, brightfield, dark-field, etc.), CD-SEM inspection, SEM inspection, electron beam inspection, electrical test, etc.) that should be used to find the yield relevant systematic defects that are likely to be present. Furthermore, the defect detection inspection and metrology methodologies or plans include refining the inspection and metrology process by grouping the process module layer layout regions based on the layout attributes (e.g., layer density, dummy fill patterns, etc.) that correspond with or account for the sensitivity of the inspection and metrology equipment to be able to detect or measure the defects or attributes of interest in the most efficient manner.

Figure 3B:
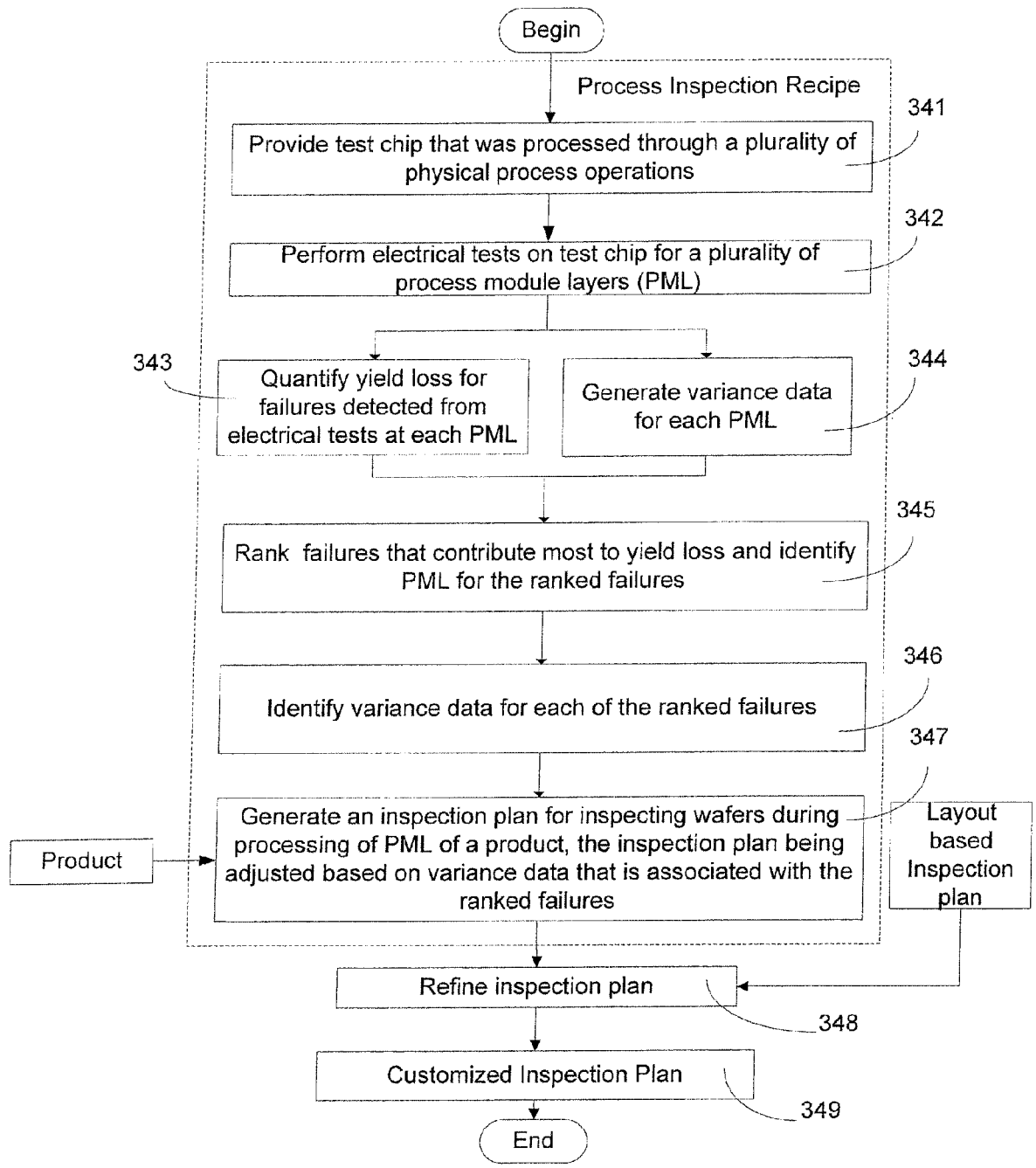
FIG. 3B illustrates another flow chart of operations for determining another customized defect detection inspection plan for an integrated circuit, in accordance with another embodiment of the present invention.
Figure 3C:
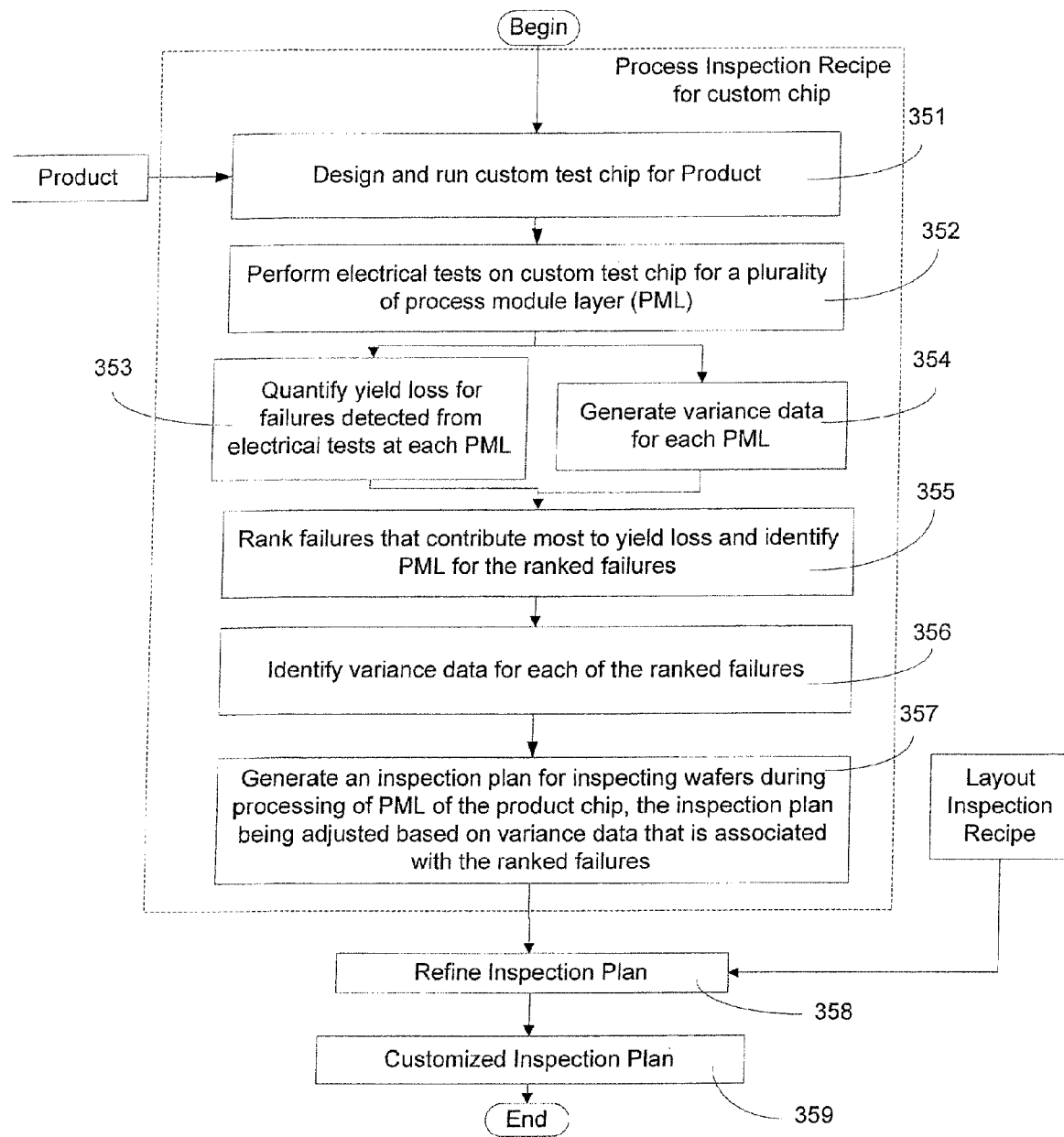
FIG. 3C illustrates yet another flow chart of operations for determining another customized defect detection inspection plan for an integrated circuit, in accordance with another embodiment of the present invention.

FIGS. 3B and 3C illustrates a flow chart of operations for creating a customized inspection plan to enable the identification of defects in a target product chip, which may be caused by one or more physical process operations. FIG. 3C is a variant of FIG. 3B.

The method begins with operation 341 where a test chip is provided. The test chip in this embodiment is a CV test chip with identifiable layout features formed by running a plurality of physical process operations. The plurality of physical process operations create a plurality of process module layers on the test chip having one or more layout features similar to those found on one or more target product chips (product chip). In the embodiment illustrated in FIG. 3C, the test chip that is provided, in operation 351, is a customized CV test chip. The plurality of process module layers and the associated plurality of layout patterns of the customized CV test chip are the same or similar to those found on a specific product chip.

As noted above, a process module layer (PML) is defined by one or more physical features defined on one or more layers of the fabricated IC chip. The physical process operations that are used to create the PMLs may implement a number of fabrication tools. These tools are commonly used to perform operations, such as, deposition of materials, photolithography, etching, planarization (CMP), cleaning, etc. A deposition process may be of different types, for instance and without limitation, physical vapor deposition, chemical vapor deposition, electrochemical deposition, molecular beam epitaxy, atomic layer deposition, etc. The patterning processes may further include wet etching, dry etching, reactive ion etching, etc. These few examples are provided to emphasize that vast variety of tools and processes that may be used during the fabrication process to define the various PMLs of a chip.

In operation 342 of FIG. 3B (352 of FIG. 3C), electrical testing is performed on the test chip in order to identify defect on the test chip. Although electrical testing is described for ease of understanding, other types of testing, such as optical tests, electron-beam tests, etc, can be performed. The electrical test is performed at each process module layer (PML) of the test chip to identify layout features that may introduce defects in the test chip.

In operation 343 of FIG. 3B (operation 353 of FIG. 3C), for each PML, a yield loss operation is calculated for all potential defects and failures that were detected during the electrical test conducted in operation 342. In one embodiment, the yield loss operation uses a yield calculator model. For more information on such models, reference can be made to U.S. Pat. No. 6,449,749, which is incorporated herein by reference.

Figure 4A:
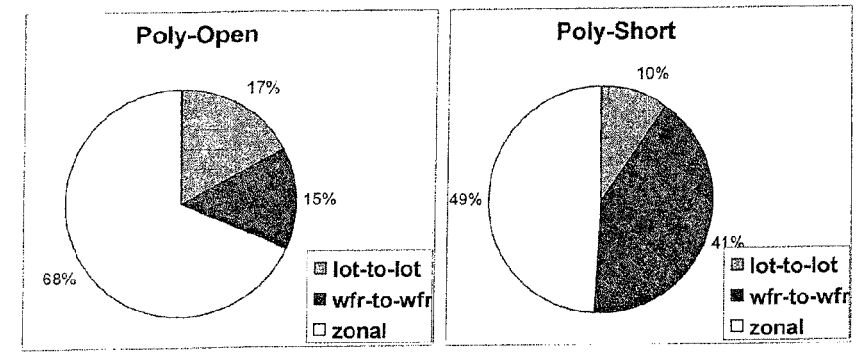
FIGS. 4A-4E illustrate variance data for particular process modular layers and failure node for integrated circuits.
Figure 4B:
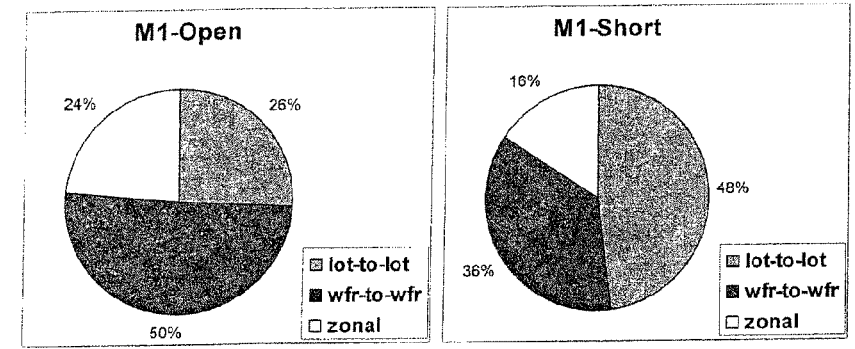
Figure 4C:
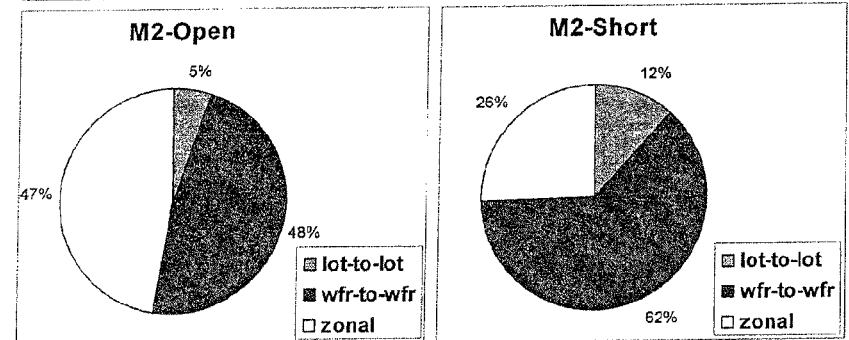
Figure 4D:
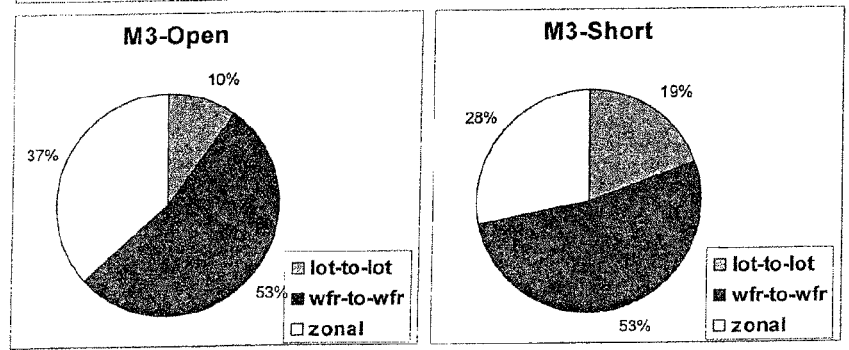
Figure 4E:
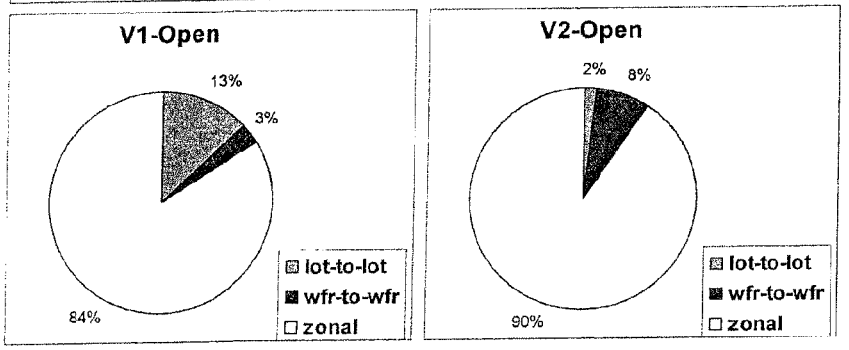

In operation 344 of FIG. 3B (operation 354 of FIG. 3C), variance data related to each of the plurality of process module layers is generated. FIGS. 4A-4E illustrate example variance data at different PMLs. FIG. 4A illustrates the PML for poly, FIG. 4B illustrates the PML for M1 (metal 1); FIG. 4C illustrates the PML for M2 (metal 2); FIG. 4D illustrates the PML for M3 (metal 3); and FIG. 4E illustrates the PML for V1 and V2 (via 1 and via 2, respectively).

The sources of the variance data can then be associated to a tool or tools used in physical process operations to create features of a PML on the test chip. This data varies, and varies in many ways. For instance, the process attributes associated with each of the plurality of physical process operations might vary from one manufacturing line of operation to another or may vary within a single manufacturing line over a period of time. As this data varies from one period to another or from one manufacturing line to another, the process attributes associated with a plurality of physical process operations are called "dynamic characteristics."

In operation 345 of FIG. 3B (operation 355 of FIG. 3C), the failures that were detected in each of the plurality of process module layers by the inspection process are ranked in accordance with which failures contribute most to yield loss. The ranked failures also identify the specific process module layers in which the ranked failures were detected.

In operation 346 of FIG. 3B (operation 356 of FIG. 3C), the variance data related to each of the ranked failures is identified. The identified variance data for each of the ranked failures include a plurality of process attributes associated with one or more physical process operations that were used to create the features or PMLs of the ranked failures.

In operation 347 of FIG. 3B (operation 357 of FIG. 3C), an inspection plan is generated. In this embodiment, the inspection plan is generated to inspect wafer during processing of specific PMLs of a product. The inspection plan is adjusted so that more concentrated inspection can be carried out on the ranked failures using the variance data. The variance data will, in one embodiment, assist in performing more or less inspections during the fabrication process, when making the product. For instance, if the variance data indicates that there is a high variance rate between lot-to-lot, then more inspection operations will be performed between lots. If the variance data indicates that the variance is high in zonal areas for specific PMLs, then more zonal inspections will be performed when that PML is being defined on the product chip. Conversely, less inspection can be performed on certain PMLs if the variance data indicates that variation is low. The inspection plan therefore enables the focus to be placed on process operations of high variability and PMLs that may contribute most to yield loss.

As illustrated in operation 348 of FIG. 3B (operation 358 of FIG. 3C), the generated inspection plan may be refined by correlating with a pattern layout inspection plan. The refined inspection plan is therefore adjusted to consider both the type and quantity of inspection steps to be performed, based on layout attributes and process variance attributes. The refined inspection plan results in a customized inspection plan as illustrated in operation 349 of FIG. 3B (operation 359 of FIG. 3C).

In one embodiment of the invention, the method includes formulating customized inspection and metrology methodologies for a target product chip. The method includes obtaining systematic signatures that are related to the product chip. The method may include fabricating one or more test chips that contain layout patterns that are representative of the layout patterns of a product chip and generating the necessary data for creating the systematic signatures that would be related to the product chip. The necessary data may be generated by performing electrical tests, inspections, etc. on the fabricated test chip. A product chip or target product chip, as mentioned in this application, relates to a particular integrated circuit chip having a general or specific operational purpose. Examples of product chips, without limitation, may include microprocessor chips, different types of memory chips (e.g., RAM, DRAM, Flash, etc.), communication chips, Application Specific Integrated Circuit (ASIC) chips, Digital Signal Processor (DSP) chips, simple logic chips, System on a Chip (SoC), etc.

In another embodiment of the invention, the inspection and metrology methods or plans for a target product chip are devised by analyzing process parameters for a plurality of physical process operations that are used to fabricate layout or features on a test chip. In yet another embodiment of the invention, inspection and metrology methods or plans are created by analyzing the layout features of a test chip or product chip and considering information related to process variations or variances (e.g., lot-to-lot sampling to identify lot-to-lot variations, wafer-to-wafer sampling to identify wafer-to-wafer variations, die-to-die or zonal sampling to identify die-to-die or zone-to-zone variations, etc.) in fabricating the process module layer of an integrated circuit on the test chip or product chip. Information on process variation or variances may be provided by well known software programs (e.g., Var Comp, ANOVA, etc.) in the semiconductor fabrication industry. For example software programs may produce variance data or illustrations (e.g., graphs, charts, tables, etc.) for various process module layers of an integrate circuit or semiconductor such as those shown in FIGS. 4A-4E. FIG. 4A shows a chart that illustrates the variance of a process module layer for poly. FIG. 4B shows a chart that illustrates the variance of a process module layer for M1 (metal 1). FIG. 4C shows a chart that illustrates the variance of a process module layer for M2 (metal 2). FIG. 4D shows a chart that illustrates the variances of a process module layer for M3 (metal 3). FIG. 4E shows a chart that illustrates the variances of a process module layer for V1 and V2 (via 1 and via 2, respectively). The sources of the different variances may be associated to a particular tool or tools used in the physical process operations in fabricating the layouts or features of a process module layer for an integrated circuit. The customized defect detection inspection and metrology methodologies in accordance with the embodiments of the present invention accounts for the variations or variances caused by the fabrication process.

Thus, the methods of the present invention enable the creation of customized inspection methodologies or plans that place special attention on particular layout or features, while increasing or decreasing inspection operations or sampling methodologies to account for variances that are likely to occur during the fabrication of a product chip. This intelligent formulation of inspection and metrology methodologies or plans therefore reallocates inspection and metrology operations to provide better detection coverage to more effectively identify yield detractors.

Figure 5:
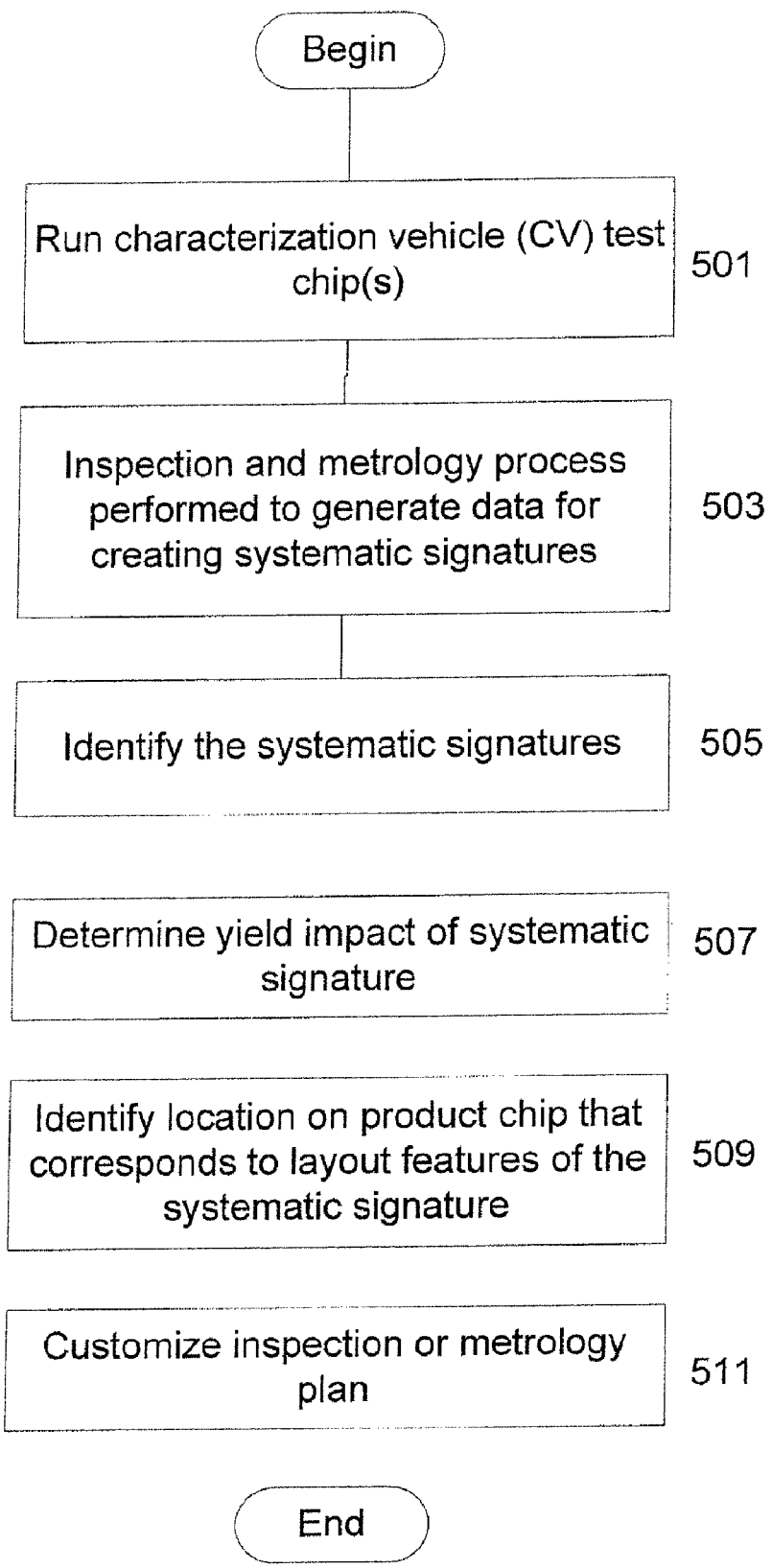
FIG. 5 illustrates a flow chart of operations or steps for developing customized defect detection inspection and metrology methodologies or plans for identifying yield relevant systematic defects in a product chip in accordance with one embodiment of the present invention.

FIG. 5 illustrates a flow chart of operations or steps for developing customized defect detection inspection and metrology methodologies or plans for identifying yield relevant systematic defects in a product chip in accordance with one embodiment of the present invention. The operations begin with step 501, a test chip (e.g., a PDF Solutions proprietary test chip, characterization Vehicle® or CV®) is fabricated using typical IC fabrication tools (semiconductor process platforms and chambers, etc.) and fabrication processes for a particular technology node (e.g., 90 nm, 65 nm, 45 nm, etc.). The fabrication of the test chip includes fabricating the various structures and layers that define the test chip. The test chip will include a multitude of features in the form of devices, including patterned lines, conductive vias and the like. Generally speaking the test chip will include several types of patterned lines that are representative of actual patterned lines, features, etc. in a product chip.

During fabrication of the chip, inspection and metrology processes are performed to generate the necessary data for creating systematic signatures associated with particular layout patterns, in step 503. The metrology processes may include performing electrical tests (such as measuring leakage current, resistance, capacitance, etc.) on the test chip to determine operational characteristics as well as other measurements to determine the layout characteristics (e.g., dimensions of features, spacing between features, underlayer density, etc.) on a process module layer. In step 505, the data may be used to generate represented relationships for systematic signatures. In addition, the data may be processed to provide an additional level of detail (e.g., defect density of a process module layer, yield of a process module layer, etc.) for generating represented relationships for systematic signatures. For example, more detail information such as defect density or yield for a particular process module layer may be tied directly to particular layout features or attributes on a process module layer for particular systematic signatures. In step 507, the systematic signatures are analyzed or examined to determine yield impacts for integrated circuits. For example, statistical models may be developed from systematic signatures to determine yield impact based on particular layout patterns for particular process module layers of integrated circuits. In step 509, the areas on the product chip that contains layout or features that correspond to layout or features that generated the systematic signature which may impact yield of integrated circuits are located. In step 511, customized defect detection inspection and metrology methodologies or plans for finding or detecting defects that are most likely to be found for those layout patterns or features on a process module layer of a product chip are defined based on the specific types of layout patterns, features, attributes, etc.

In another embodiment of the present invention, the process for developing customized defect detection inspection and metrology methodologies or plans for identifying yield relevant systematic defects in a product chip further includes well known sampling methods for performing the inspection or metrology procedures to account for process variations in fabricating the product chip to address potential lot-to-lot variations, wafer-to-wafer variations, die-to-die variations or zone-to-zone variations to accurately identify yield relevant systematic defects.

In yet another embodiment of the present invention, the process for developing customized defect detection inspection and metrology methodologies or plans further includes determining a capture rate to assess the effectiveness of the defect detection inspection and metrology methodologies or plans in detecting yield relevant systematic defects. For example, the capture rate identifies the effectiveness of the inspection or metrology tools in detecting yield relevant systematic defects. Thus, by determining the capture rate for the inspection or metrology process and tools, one can determine the effectiveness of the customized defect detection inspection and metrology methodologies or plans and streamline for inspection and metrology process to focus on or only use the inspection and metrology process and tools that are capable of identifying yield relevant systematic defects.

Figure 6:
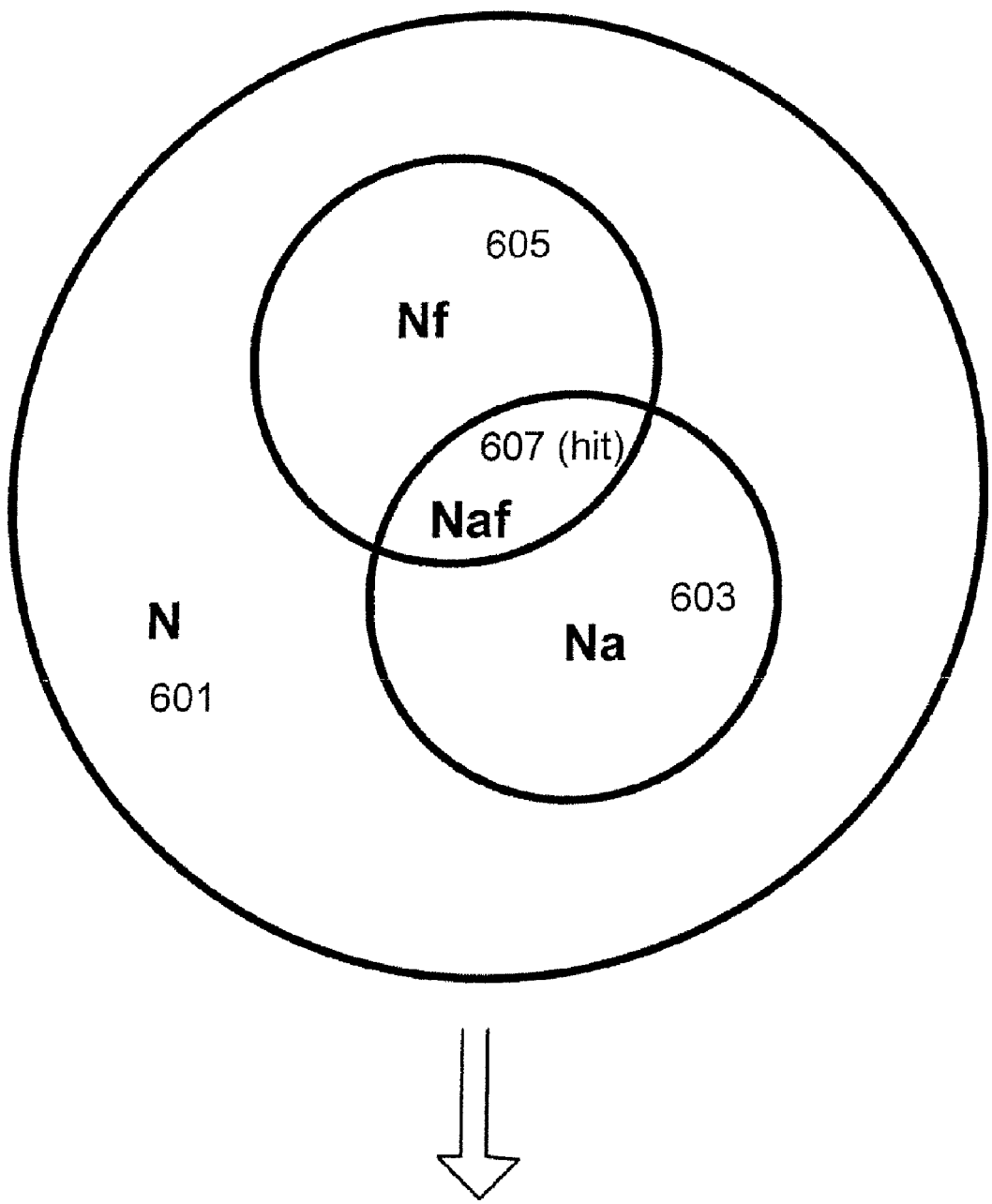
FIG. 6 illustrates the concept of capture rate, in accordance with one embodiment of the present invention.

As discussed above, the capture rate identifies the degree by which particular defects associated with particular layout patterns, features, attributes, etc. may actually be detected by using the customized defect detection inspection and metrology methodologies or plans with the specified inspection and metrology process and equipment. FIG. 6 illustrates one method for determining or calculating a capture rate for a layout pattern with particular features, attributes, etc., for a region or location on a process module layer of an integrated circuit. A wafer may include a plurality of integrated circuits. An inspection process is performed at various process steps while the wafer is being fabricated. The wafers are then tested electrically. The electrical data may include a total of selected test regions (N) 601 on the wafer as illustrated in FIG. 6. Each of the integrated circuit includes a plurality of process module layers. Each of the process module layers have a plurality of associated systematic signatures and one or more of the plurality of systematic signatures may be part of the selected test region. The defects (Na) (defect regions) found during the inspection within the selected test regions 601 is denoted by region 603, and the failed electrically tested regions with failures (NO (failure regions) are denoted by region 605 within the selected test regions 601. An intersecting region (Naf) 607 represents the portion of the electrical failure regions 605 that also had a defect found during inspection 603. Intersecting region 607 may also be referred to as a "Hit" region. A Hit region represents a selected test region (a location on the process module layer) that was verified by the inspection process. For example, capture rate in accordance with embodiments of the present invention may be calculated using measured test data (i.e., electrical data from a test chip, etc.) and may be defined by Capture rate=Naf/Nf. Although the capture rate has been shown to be calculated in a particular way as illustrated in FIG. 6, capture rate may be calculated or determined in numerous ways and it is not limited to the method shown and discussed.

FIG. 7 illustrates considerations that may used in optimizing a customized inspection plan. FIG. 8 illustrates example benefits of implementing the customized inspection plan, of one embodiment of the present invention. This example also shows how the inspection strategies can be adjusted to accommodate for variances in spatial systematic, layout attribute systematic and physical process operations resulting in an optimally customized inspection plan.

With the above embodiments in mind, it should be understood that the present invention may employ various computer-implemented operations involving data stored in computer systems. These operations may require manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, DVDs, CD-Rs, CD-RWs, magnetic tapes, and other optical and non-optical data storage devices. The computer readable medium can also be distributed over a network of coupled computer systems so that the computer readable code is stored and executed in a distributed fashion.

It will be obvious, however, to one skilled in the art, that the present invention may be practiced without some or all of these specific details. In other instances, well known process operations have not been described in detail in order not to unnecessarily obscure the present invention.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for determining customized defect detection inspection plan, comprising:
   fabricating a test chip;
   generating test chip data from the fabricated test chip;
   defining systematic signatures from the generated test chip data, wherein said systematic signatures define relationships between measurable metrics associated with said fabricated test chip and measurable layout attributes associated with a layout pattern of said fabricated test chip;
   identifying a yield relevant systematic signature from the defined systematic signatures;
   identifying the layout pattern associated with the yield relevant systematic signature;
   locating the identified layout pattern on a process module layer of a product chip; and
   defining a customized defect detection inspection or metrology methodology for detecting systematic defects on the process module layer based on the identified layout pattern associated with the yield relevant systematic signature.

2. The method of claim 1, further comprising:
   determining a capture rate for the customized defection inspection or metrology methodology for detecting systematic defects.

3. The method of claim 1, further comprising:
   defining a sampling method for performing defect detection inspection or metrology methodology that is capable of accounting for process variations in fabricating the product chip.

4. The method of claim 3, wherein the sampling method is capable of identifying process variations related to lot-to-lot variations, wafer-to-wafer variations, die-to-die variations, or zone-to-zone variations.

5. The method of claim 1, further comprising:
   ranking the detected systematic defects on the product chip based on impact to yield; and
   defining an improvement plan to reduce the detected systematic defects, wherein the improvement plan includes modifying one or more layout patterns or features of the product chip or one or more fabrication parameters for fabricating the product chip.

6. A method for determining customized defect detection inspection plan, the method comprising:
   identifying a yield relevant systematic signature, wherein said systematic signature defines a relationship between measurable metrics associated with a fabricated test chip and measurable layout attributes associated with a layout pattern of said fabricated test chip;
   identifying the layout pattern associated with the yield relevant systematic signature; and
   defining a customized defect detection inspection or metrology methodology for detecting systematic defects based on the identified layout pattern associated with the yield relevant systematic signature.

7. The method of claim 6, wherein the yield relevant systematic signature is developed from test chip data, the chip data being produced from a fabricated test chip.

8. The method of claim 6, wherein the yield relevant systematic signature is determined from product inspection, metrology, or electrical data, or failure analysis.

9. The method of claim 7, wherein the customized defect detection inspection or metrology methodology is performed on a product chip to detect systematic defects that could impact yield of integrated circuits on the product chip.

10. The method of claim 9, further comprising:
    determining a capture rate for the customized defect detection inspection or metrology methodology for detecting systematic defects on the product chip.

11. The method of claim 9, further comprising:
    determining a sampling method for performing the inspection or metrology methodology for identifying systematic defects on the product chip, wherein the sampling method is capable of accounting for process variations in fabricating the product chip.

12. The method of claim 11, wherein the sampling method is capable of identifying process variations related to lot-to-lot variations, wafer-to-wafer variations, die-to-die variations, or zone-to-zone variations.

13. The method of claim 9, further comprising:
    ranking the detected systematic defects on the product chip based on impact to yield; and
    defining an improvement plan to reduce the detected systematic defects, wherein the improvement plan includes modifying one or more layout patterns or features of the product chip or one or more fabrication parameters for fabricating the product chip.

14. A method for making a customized inspection plan for optimizing the identification of defects on a target product chip during manufacture, comprising:
    running a test chip through a plurality of processes and identifying a plurality of layout patterns that define systematic signatures, the test chip including particular layout patterns similar to those to be found in the target product chip, wherein said systematic signatures define relationships between measurable metrics associated with said test chip and measurable layout attributes associated with a layout pattern of said test chip;

determining a product type for the target product chip and selecting particular systematic signatures capable of being found in the product type;

locating the particular systematic signatures on pattern layouts of the target product chip; and defining an inspection plan to address each of the particular systematic signatures on the target product chip during fabrication of the target product chip.

15. A method for making a customized inspection plan for optimizing the identification of defects on a target product chip during manufacturer of claim 14, further comprising, calculating capture rate for the layout patterns of the systematic signatures;

determining which of the layout patterns of the systematic signatures have greater capture rates relative to others; and filtering out the systematic signatures to be located on the pattern layouts of the target product chip based on the capture rate, wherein high capture rates indicate a higher likelihood of not filtering out the systematic signatures.

16. A method for making a customized inspection plan for optimizing the identification of defects on a target product chip during manufacturer of claim 14, further comprising, evaluating a yield impact for each of the systematic signatures; and filtering out the systematic signatures based on the yield impact.

17. A method for making a customized inspection plan for optimizing the identification of defects on a target product chip during manufacturer of claim 14, wherein the systematic signatures of the test chip define characteristics as they relate to fixed pattern layouts.

18. A method for making a customized inspection plan for optimizing the identification of defects on a target product chip during manufacturer of claim 14, further comprising:

identifying don't care systematic signatures; and excluding the don't care systematic signatures from the inspection plan.

19. A method for making a customized inspection plan for optimizing the identification of defects on a target product chip during manufacturer of claim 14, wherein defining an inspection plan further comprising:

determining which of the identified systematic signatures most impact yield; and creating an inspection plan based on the identified systematic signatures, the inspection plan providing reduced inspection of the identified systematic signatures having low yield impact.

20. A method for making a customized inspection plan for optimizing the identification of defects on a target product chip during manufacturer of claim 14, further comprising:

refining the inspection plan to include a process based inspection data, the refinement allowing for adjustments to type and quantity of inspection steps to be performed using the refined inspection plan, wherein the process based inspection data is obtained by analyzing variance data related to process attributes of a plurality of physical process operations used to fabricate the test chip.

21. A method for making a customized inspection plan for identifying defects on a target product chip, comprising:

providing a test chip, the test chip defined by running a plurality of physical process operations to create a plurality of process module layers on the test chip, each of the plurality of process module layers including a plurality of layout features on the test chip similar to those to be found in the target product chip;

performing electrical tests on the test chip, the electrical test identifying layout features having a failure;

quantifying yield loss for each failure in each of the plurality of process module layers;

referencing variance data for each of the plurality of process module layers, the variance data including data related to the plurality of physical process operations used in creating the layout features in each of the plurality of process module layers of the test chip;

ranking failures that contribute most to yield loss, the failures detected on the test chip identifying the specific layout feature and the specific process module layer associated with each of the failures;

identifying the variance data associated with each of the ranked failures; and generating an inspection plan for inspecting product chips during processing of each of the plurality of process module layers of the product chip, the inspection plan being adjusted based on the identified variance data associated with each of the ranked failures on the test chip.

22. The method for making a customized inspection plan for identifying defects on a target product chip of claim 21, wherein quantifying yield loss at each of the plurality of process module layers further comprising:

identifying types of failures and failure rates based on tests performed on each of the plurality of process module layers of the test chip; and calculating yield loss data for each of the plurality of process module layers of the test chip based on types of failure and failure rates using a yield calculator model.

23. The method for making a customized inspection plan for identifying defects on a target product chip of claim 21, wherein generating variance data further comprising:

identifying each of the plurality of physical process operations used in creating each of the layout features in each of the plurality of process module layers on the test chip; and receiving process attributes for each of the identified physical process operations.

24. The method for making a customized inspection plan for identifying defects on a target product chip of claim 21, wherein the process attributes for each of the identified physical process operations relate to a physical process operation tool associated with the identified physical process operation.

25. The method for making a customized inspection plan for identifying defects on a target product chip of claim 21, wherein the inspection plan is adjusted based on the identified variance data associated with each of the ranked failures on the test chip, and the adjusting serving to increase or decrease a type of inspection per wafer, increase or decrease a rate of inspection per lot, and increase or decrease a zonal inspection on selected wafers.

26. The method for making a customized inspection plan for identifying defects on a target product chip of claim 21, further comprising:

refining the inspection plan to include factors determined during a pattern layout inspection, the refinement allowing for adjustments to type and quantity of inspection steps to be performed using the refined inspection plan, wherein the pattern layout inspection is obtained by analyzing systematic signatures of the layout features of the test chip.

27. The method for making a customized inspection plan for identifying defects on a target product chip of claim 23, wherein the process attributes change dynamically based on process environment and fabrication lines.

28. A method for making a customized inspection plan for identifying defects on a target product chip, comprising:

providing a test chip, the test chip defined by running a plurality of physical process operations to create a plurality of process module layers on the test chip, each of the plurality of process module layers on the test chip including layout features to be found on the product chip;

performing a test on the test chip, the test identifying failures on the test chip;

quantifying yield loss for the failures detected at each of the plurality of process module layers on the test chip;

obtaining variance data for each of the plurality of process module layers based on tests performed on the test chip, the variance data including data related to the plurality of physical process operations used in creating the layout features in each of the plurality of process module layers of the test chip;

ranking failures that contribute most to yield loss;

identifying the variance data associated with each of the ranked failures; and generating an inspection plan for inspecting target product chips during processing of each of the plurality of process module layers of the target product chip, the inspection plan being adjusted based on the variance data associated with each of the ranked failures on the test chip.

29. The method for making a customized inspection plan for identifying defects on a target product chip of claim 28, wherein the inspection plan being adjusted includes:

making adjustments to type and quantity of inspection steps to be performed during execution of the inspection plan.

30. The method for making a customized inspection plan for identifying defects on a target product chip of claim 29, further comprising:

making additional adjustments to the inspection plan based on which of a plurality of systematic signatures are to be inspected, based on a layout based inspection plan.

31. A method for refining an inspection plan used to inspect for defects during fabrication operations performed on wafers to define integrated circuit chips, comprising:

obtaining data from a characterization vehicle (CV) test chip, the CV test chip having features similar to those to be formed on a product chip, and the data including identification of potential failures associated with particular layout features of a plurality of layout features that define the CV test chip;

quantifying the potential failures associated with the particular layout features, the quantifying being configured to assign a yield impact and process variance to the potential failures;

generating an inspection plan for inspecting wafers used to produce the product chip;

wherein the inspection plan is filtered as to which of the particular layout features are to be inspected, wherein the process variance is used to adjust inspection routines, such as to increase or decrease a type of inspection per wafer, increase or decrease a rate of inspection per lot of wafers, or increase or decrease a zonal inspection on selected wafers.

32. A method for refining an inspection plan used to inspect for defects during fabrication operations performed on wafers to define integrated circuit chips as recited in claim 31, wherein the data including identification of potential failures is obtained by performing one of electrical tests, e-beam tests, SEM tests, or optical tests.

33. A method for making an inspection plan for optimizing the identification of defects on a target product chip, comprising:

identifying a plurality of layout patterns that define systematic signatures, wherein said systematic signatures define relationships between measurable metrics associated with said target product chip and measurable layout attributes associated with a layout pattern of said target product chip;

locating the particular systematic signatures on pattern layouts of the target product chip; and defining an inspection plan to address each of the particular systematic signatures on the target product chip during fabrication of the target product chip.

34. The method of claim 33, wherein identifying the plurality of layout patterns is facilitated by examining fabrication information of a test chip.

35. The method of claim 33, further comprising:

determining a product type for the target product chip and selecting particular systematic signatures capable of being found in the product type, the systematic signatures defining features that can potentially introduce a defect in a test chip.

36. The method of claim 33, wherein the test chip is run through a plurality of process operations to generate information regarding the test chip.

37. The method of claim 36, wherein the information includes data regarding patterns found in the test chip.

38. The method of claim 33, further comprising, calculating capture rate for the layout patterns of the systematic signatures;

determining which of the layout patterns of the systematic signatures have greater capture rates relative to others; and filtering out the systematic signatures to be located on the pattern layouts of the target product chip based on the capture rate, wherein high capture rates indicate a higher likelihood of not filtering out the systematic signatures.

39. The method of claim 33, further comprising, evaluating a yield impact for each of the systematic signatures; and filtering out the systematic signatures based on the yield impact.

40. The method of claim 33, wherein the systematic signatures of the test chip define characteristics as they relate to fixed pattern layouts.

41. The method of claim 33, further comprising:

identifying don't care systematic signatures; and excluding the don't care systematic signatures from the inspection plan.

* * * * *